United States Patent
Nakamura et al.

(10) Patent No.: US 9,508,895 B2
(45) Date of Patent: Nov. 29, 2016

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventors: Ryo Nakamura, Kiyosu (JP); Misato Boyama, Kiyosu (JP)

(73) Assignee: Toyoda Gosei Co., Ltd., Kiyosu-shi, Aichi-ken (JP)

(*) Notice: Subject to any disclaimer, the term of this patent is extended or adjusted under 35 U.S.C. 154(b) by 0 days.

(21) Appl. No.: 14/617,768

(22) Filed: Feb. 9, 2015

(65) Prior Publication Data
US 2015/0236198 A1    Aug. 20, 2015

(30) Foreign Application Priority Data
Feb. 19, 2014  (JP) ................. 2014-029974

(51) Int. Cl.
*H01L 33/06*  (2010.01)
*H01L 33/32*  (2010.01)
*H01L 33/00*  (2010.01)

(52) U.S. Cl.
CPC ............ *H01L 33/06* (2013.01); *H01L 33/007* (2013.01); *H01L 33/32* (2013.01)

(58) Field of Classification Search
CPC ..... H01L 33/06; H01L 33/007; H01L 33/32; H01S 5/3407; H01S 5/34333
See application file for complete search history.

(56) References Cited

U.S. PATENT DOCUMENTS

| | | | | |
|---|---|---|---|---|
| 6,459,100 B1* | 10/2002 | Doverspike | ........... | H01L 33/007 257/103 |
| 2005/0170537 A1* | 8/2005 | Hooper | ................. | B82Y 20/00 438/22 |
| 2011/0168974 A1* | 7/2011 | Okuno | .................... | H01L 33/32 257/13 |
| 2012/0007113 A1* | 1/2012 | Hwang | .................. | H01L 33/06 257/94 |
| 2013/0187125 A1* | 7/2013 | Yeh | ......................... | H01L 33/06 257/13 |

FOREIGN PATENT DOCUMENTS

JP    2010-080619 A    4/2010

OTHER PUBLICATIONS

Zhao et al., "Analysis of Internal Quantum Efficiency and Current Injection Efficiency in III-Nitride Light-Emitting Diodes", Apr. 2013, Journal of Display Technology, vol. 9, No. 4, 212-225.*

* cited by examiner

*Primary Examiner* — Joshua King
(74) *Attorney, Agent, or Firm* — McGinn IP Law Group, PLLC

(57) ABSTRACT

The present invention provides a Group III nitride semiconductor light-emitting device exhibiting improved emission performance. A light-emitting layer has a MQW structure in which a plurality of layer units are repeatedly deposited, each layer unit comprising a well layer, a protective layer, and a barrier layer sequentially deposited. The protective layer has a layered structure comprising a second protective layer disposed in contact with and on the well layer, and a first protective layer disposed in contact with and on the second protective layer. The second protective layer is formed of GaN. The first protective layer is formed of AlGaInN. The first protective layer has a bandgap larger than that of the well layer and not larger than that of the barrier layer. Moreover, the first protective layer has an In composition ratio of more than 0% and not more than 4%.

6 Claims, 3 Drawing Sheets

GROUP III NITRIDE SEMICONDUCTOR LIGHT-EMITTING DEVICE AND PRODUCTION METHOD THEREFOR

BACKGROUND OF THE INVENTION

Field of the Invention

The present invention relates to a Group III nitride semiconductor light-emitting device characterized by the structure of light-emitting layer. More specifically, the light-emitting layer has a MQW structure in which a plurality of layer units are repeatedly deposited, each layer unit comprising a well layer, a protective layer, and a barrier layer sequentially deposited, and is characterized by the protective layer. The present invention also relates to a method for producing the Group III nitride semiconductor light-emitting device.

Background Art

A MQW structure comprising an InGaN well layer and an AlGaN barrier layer alternately and repeatedly deposited, is widely used as a light-emitting layer of Group III nitride semiconductor light-emitting device. Since the barrier layer is formed of AlGaN, the growth temperature of the barrier layer must be higher than that of the well layer to grow with good crystallinity. Therefore, after the formation of the well layer, it is necessary to raise the temperature, and then grow the barrier layer. However, In is evaporated from the well layer due to heating up, thereby causing reduction in emission performance or variation in emission wavelength. Therefore, a protective layer is provided between the well layer and the barrier layer, which is grown at the same temperature as the growth temperature of the well layer, thereby preventing the evaporation of In.

Japanese Patent Application Laid-Open (kokai) No. 2010-80619 discloses that a protective layer comprises a single AlGaN layer or a layered structure of GaN and AlGaN.

However, when the AlGaN protective layer is grown at the same temperature as employed for the well layer, the layer exhibits low crystal quality so that the carrier confinement effect is reduced or carriers are trapped in the protective layer, resulting in reduction of emission performance.

SUMMARY OF THE INVENTION

Accordingly, an object of the present invention is to improve emission performance of the Group III nitride semiconductor light-emitting device having a MQW-structure light-emitting layer.

The present invention is a Group III nitride semiconductor light-emitting device having a MQW-structure light-emitting layer wherein the light-emitting layer has a structure in which a plurality of layer units are repeatedly deposited, each layer unit comprising a well layer, a protective layer, and a barrier layer. The well layer contains In, the protective layer comprises a first protective layer formed of AlGaInN having a bandgap larger than that of the well layer and an In composition ratio of more than 0% and not more than 4%, and the barrier layer contains Al.

The In composition ratio is a percentage (mol %) of In in the total Group III metals constituting Group III nitride semiconductor. The first protective layer has an In composition ratio of more preferably, 1.5% to 3.5%, and further preferably, 2% to 3%.

The protective layer may have a layered structure comprising a second protective layer formed of GaN disposed on the well layer and a first protective layer in contact with and on the second protective layer. In this case, the first protective layer preferably has a thickness of 0.2 nm to 1.8 nm, and the second protective layer preferably has a thickness of 0.2 nm to 1.8 nm. Such a thickness range of the first and second protective layers reduces carrier recombination or trapping in the protective layer, thereby improving emission performance. Moreover, preferably, the barrier layer is formed of AlGaN, and the first protective layer has an Al composition ratio of four to five times the Al composition ratio of the barrier layer. Thus, the carrier confinement effect in the well layer can be improved, thereby improving emission performance.

The protective layer may be a single layer comprising only the first protective layer. In this case, the first protective layer preferably has a thickness of 0.2 nm to 1.8 nm. The carrier recombination or trapping in the protective layer is reduced, thereby improving emission performance.

In the present invention, the protective layer comprises a first protective layer formed of AlGaInN having a bandgap larger than that of the well layer and an In composition ratio of more than 0% and not more than 4%. Such a composition of the protective layer reduces the pits in the protective layer due to the effect of In as a surfactant, and increases the crystallinity, thereby improving emission performance.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

[Device Structure]

Figure 1:
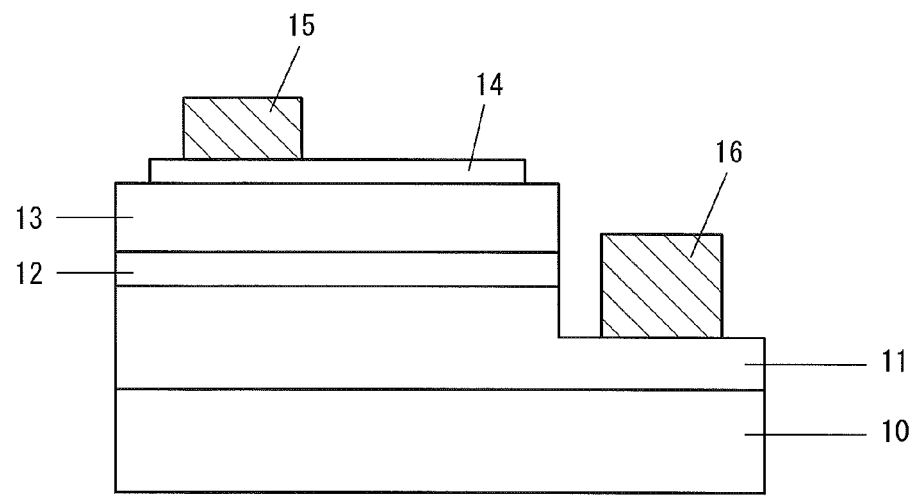
FIG. 1 shows the structure of a Group III nitride semiconductor light-emitting device according to Embodiment 1.

FIG. 1 shows the structure of a Group III nitride semiconductor light-emitting device according to Embodiment 1. As shown in FIG. 1, the Group III nitride semiconductor light-emitting device according to Embodiment 1 is a face-up type light-emitting device comprising a sapphire substrate 10, an n-type layer 11 disposed on the sapphire substrate 10, a light-emitting layer 12 disposed on the n-type layer 11, a p-type layer 13 disposed on the light-emitting layer 12, transparent electrode 14a disposed on a part of the p-type layer 13, a p-electrode 15, and an n-electrode 16.

The sapphire substrate 10 is a growth substrate for crystal growing Group III nitride semiconductor on a main surface thereof. The main surface is, for example, an a-plane or c-plane. On the surface of the sapphire substrate 10, unevenness of concave and convex may be formed in a dot pattern or a stripe pattern to improve light extraction performance. The sapphire substrate 10 may be replaced with a substrate formed of, for example, GaN, SiC, ZnO, or Si.

The n-type layer 11 is disposed via an AlN buffer layer (not illustrated) on the uneven surface of the sapphire substrate 10. Moreover, the n-type layer 11 has a layered structure in which an n-type contact layer, an ESD layer, and an n-type cladding layer are deposited in this order on the sapphire substrate 10. The n-type contact layer is formed of, for example, n-GaN having a Si concentration of $1\times10^{18}/cm^3$ or more. The n-type contact layer may comprise a plurality of layers having different Si concentrations. The ESD layer has a layered structure including an non-doped GaN layer and an n-GaN layer, and serves as a layer for improving electrostatic breakdown voltage. The n-type cladding layer has a superlattice structure in which an InGaN layer and an n-GaN layer are alternately and repeatedly deposited.

Figure 2:
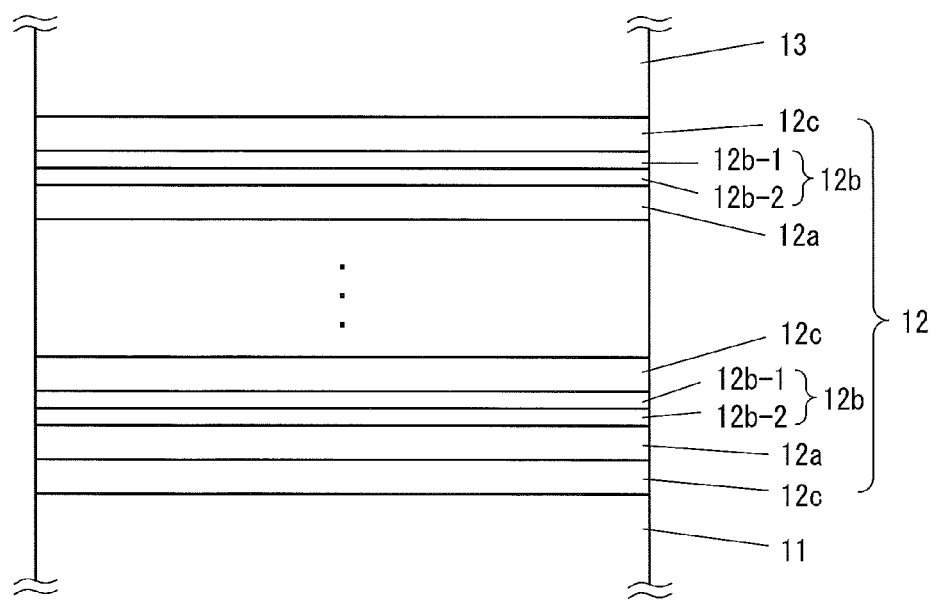
FIG. 2 shows the structure of a light-emitting layer 12.

The light-emitting layer 12, as shown in FIG. 2, has a MQW structure in which a plurality of layer units are repeatedly deposited, each layer unit comprising a well layer 12a, a protective layer 12b, and a barrier layer 12c deposited in this order. The number of repetitions is three to ten times. The n-type layer 11 and the p-type layer 13 are both in contact with the respective nearest layers of the barrier layer 12c. The overall thickness of the light-emitting layer 12 is 500 nm to 700 nm. The structure of the light-emitting layer 12 will be later described in details.

The p-type layer 13 has a layered structure in which a p-type cladding layer and a p-type contact layer are sequentially deposited on the light-emitting layer 12. The p-type cladding layer may have a superlattice structure in which a p-InGaN layer and a p-AlGaN layer are alternately and repeatedly deposited on the light-emitting layer 12. The p-InGaN layer has an In composition ratio of 5% to 12%, and a thickness of 2 nm. The p-AlGaN layer has an Al composition ratio of 25% to 40%, and a thickness of 2.5 nm. The p-type contact layer on the p-type cladding layer is formed of p-GaN having a Mg concentration of $1\times10^{19}/cm^3$ or more, and a thickness of 80 nm. The p-type contact layer may comprise a plurality of layers having different Mg concentrations.

The transparent electrode 14 is formed of ITO so as to cover almost the entire surface of the p-type layer 13. The transparent electrode 14 may be formed of, for example, IZO (Indium Zinc Oxide) and ICO (Indium Cerium-Oxide) other than ITO.

The p-electrode 15 is disposed on the transparent electrode 14. The n-electrode 16 is disposed on the n-type contact layer of the n-type layer 11 exposed in the bottom surface of the trench. The trench is provided in a part of the semiconductor layer (n-type layer 11, light-emitting layer 12, and p-type layer 13), and has a depth extending from the surface of the p-type layer 13 to the n-type contact layer of the n-type layer 11. The p-electrode 15 and the n-electrode 16 have a pad portion to which a wire is connected, and a wiring portion continuous with the pad portion, which extends in a linear pattern.

The structure of the light-emitting layer 12 will next be described in detail with reference to FIG. 2.

The well layer 12a is formed of InGaN having an In composition ratio within such a range that the emission wavelength is 380 nm to 460 nm. The well layer 12a has a thickness within a range of 1 nm to 5 nm.

The protective layer 12b has a layered structure comprising a second protective layer 12b-2 in contact with and on the well layer 12a, and a first protective layer 12b-1 in contact with and on the second protective layer 12b-2. The protective layer 12b is a layer to prevent the evaporation of In from the well layer 12a while rising a temperature to that for forming the barrier layer 12c after the formation of the well layer 12a.

The second protective layer 12b-2 is formed of GaN having a thickness of 0.2 nm to 1.8 nm. Such a thickness range of the second protective layer 12b-2 reduces carriers trapped or recombined in the second protective layer 12b-2, thereby improving emission performance. The thickness range is, more preferably, 0.5 nm to 1.6 nm, and further preferably, 0.5 nm to 1.1 nm. By providing the second protective layer 12b-2 having a lattice constant closer to that of the well layer 12a between the first protective layer 12b-1 and the well layer 12a, the crystallinity of the protective layer 12b is increased, thereby improving emission performance.

The first protective layer 12b-1 is formed of AlGaInN. Moreover, the first protective layer 12b-1 has a bandgap larger than that of well layer 12a. The first protective layer 12b-1 has an In composition ratio of more than 0% and not more than 4%. When the Group III nitride semiconductor is doped with In, In acts as a surfactant to suppress growth in a vertical direction (thickness direction) and promote growth in a lateral direction (direction parallel to main surface). Therefore, most pits on the second protective layer 12b-2 are filled by forming the first protective layer 12b-1 containing In. As a result, the pits on the protective layer 12b can be reduced, and the crystallinity of the protective layer 12b can be improved, thereby improving emission performance. However, new defects (different from pits) occur by doping with In, thus reducing emission performance. When the In composition ratio exceeds 4%, the reduction of emission performance due to the increase of new defects exceeds the effect of improving emission performance by doping with In. Therefore, In composition ratio of the first protective layer 12b-1 is in the range of more than 0% and not more than 4%.

When actually producing the first protective layer 12b-1, it is difficult to set the In concentration of the first protective layer 12b-1 to $1\times10^{16}/cm^3$ or less. Therefore, "In composition ratio of more than 0%" substantially means an In composition ratio such that the In concentration is $1\times10^{16}/cm^3$ or more.

The first protective layer 12b-1 has an In composition ratio of more preferably, 1.5% to 3.5%, and further preferably, 2% to 3%.

The first protective layer 12b-1 may have any Al composition ratio so long as the first protective layer 12b-1 has a bandgap larger than that of the well layer 12a. For example, the Al composition ratio may be four to five times the Al composition ratio of the barrier layer 12c.

The first protective layer 12b-1 has a thickness of 0.2 nm to 1.8 nm. Such a thickness range reduces carriers trapped or recombined in the first protective layer 12b-1, thereby improving emission performance. The thickness range of the first protective layer 12b-1 is, more preferably, 0.5 nm to 1.6 nm, and further preferably, 0.5 nm to 1.1 nm.

The barrier layer 12c is formed of AlGaN having an Al composition ratio of 3% to 10%, and a thickness of 1 nm to 10 nm. The barrier layer 12c is not limited to a single AlGaN layer. It may comprise a plurality of layers, for example, layers having different Al composition ratios.

As mentioned above, in the Group III nitride semiconductor light-emitting device according to Embodiment 1, the protective layer 12b of the light-emitting layer 12 has a layered structure obtained by sequentially depositing the second protective layer 12b-2 formed of GaN and the first protective layer 12b-1 formed of AlGaInN, and the first protective layer 12b-1 has an In composition ratio of more than 0% and not more than 4%. Therefore, the reduction of light intensity due to the formation of the protective layer 12b is suppressed, thereby improving the light intensity.

[Production Process]

Next will be described processes for producing the Group III nitride semiconductor light-emitting device according to Embodiment 1.

Firstly, a sapphire substrate 10 is prepared, and the sapphire substrate 10 is heated in a hydrogen atmosphere for surface cleaning. Subsequently, an AlN buffer layer (not illustrated), an n-type layer 11, a light-emitting layer 12, and a p-type layer 13 are sequentially deposited on the sapphire substrate 10 through MOCVD. The raw material gases employed in MOCVD are as follows: ammonia ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as an n-type doping gas; bis(cyclopentadienyl)magnesium (Mg $(C_5H_5)_2$) as a p-type doping gas; and $H_2$ and $N_2$ as carrier gases.

Here, a process for forming the light-emitting layer 12 is described in more detail.

The light-emitting layer 12 is formed by repeatedly depositing a plurality of layer units, each layer unit comprising a well layer 12a, a second protective layer 12b-2, a first protective layer 12b-1, and a barrier layer 12c deposited in this order.

The well layer 12a is formed at a temperature of 700 C.° to 850 C.°. The second protective layer 12b-2 is formed on the well layer 12a at the same temperature as the growth temperature of the well layer 12a. The first protective layer 12b-1 is formed on the second protective layer 12b-2 at the same temperature as the growth temperature of the well layer 12a. The barrier layer 12c is formed on the first protective layer 12b-1 in a temperature range of 765 C.° to 985 C.° which is higher than the growth temperature of the first protective layer 12b-1. The barrier layer 12c can be grown with excellent crystallinity by growing at a temperature higher than that employed for the first protective layer 12b-1, thereby improving emission performance. Here, rising of temperature is required for forming the barrier layer 12c. During heating up, In does not evaporate from the well layer 12a because the well layer 12a is covered with the protective layer 12b, thereby suppressing the reduction of emission performance.

Thus, a MQW-structure light-emitting layer 12 is formed by repeatedly depositing a well layer 12a, a protective layer 12b, and a barrier layer 12c.

Subsequently, an ITO transparent electrode 14 is formed on a predetermined region of the p-type layer 13. The predetermined region of the p-type layer 13 is dry etched to form a trench having a depth extending from the top surface of the p-type layer 13 to the n-type contact layer of the n-type layer 11. Next, a p-electrode 15 is formed on the transparent electrode 14, and an n-electrode 16 is formed on the surface of the n-type contact layer exposed in the bottom surface of the trench. Thus, the Group III nitride semiconductor light-emitting device according to Embodiment 1 shown in FIG. 1 is produced.

Example 1

Figure 3:
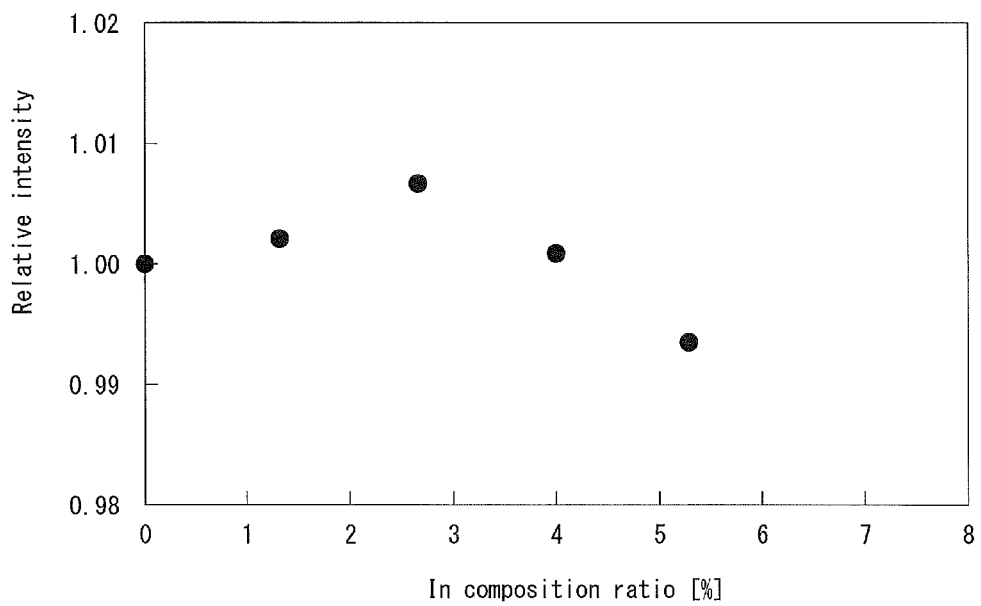
FIG. 3 is a graph showing the relationship between the In composition ratio and the relative intensity of an emitted light.

FIG. 3 is a graph showing the relationship between the In composition ratio of the first protective layer 12b-1 and the relative intensity. The relative intensity is defined as a ratio of the intensity at any In composition ratio to the intensity at the In composition ratio of 0%, that is, when the first protective layer 12b-1 is formed of AlGaN.

As is clear from FIG. 3, the relative intensity changes in a curve having a peak around the In composition ratio of 3% against the change of the In composition ratio. That is, the relative intensity monotonously increases as the In composition ratio increases until the In composition ratio reaches 3%. When the In composition ratio exceeds 3%, the relative intensity monotonously decreases as the In composition ratio increases. When the In composition ratio exceeds 4%, the relative intensity is less than 1.00, and the relative intensity is more reduced than the case when the In composition ratio is 0%.

From the above, the In composition ratio is more than 0% and not more than 4%, the relative intensity can be more improved than the case when the first protective layer 12b-1 is not doped with In. Particularly when the In composition ratio is not less than 1.5% and not more than 3.5%, the relative intensity can be more improved by 0.2% or more compared to the case when the first protective layer 12b-1 is not doped with In. When the In composition ratio is not less than 2% and not more than 3%, the light output can be further improved by 0.4% or more compared to the case when the first protective layer 12b-1 is not doped with In.

Example 2

Figure 4:
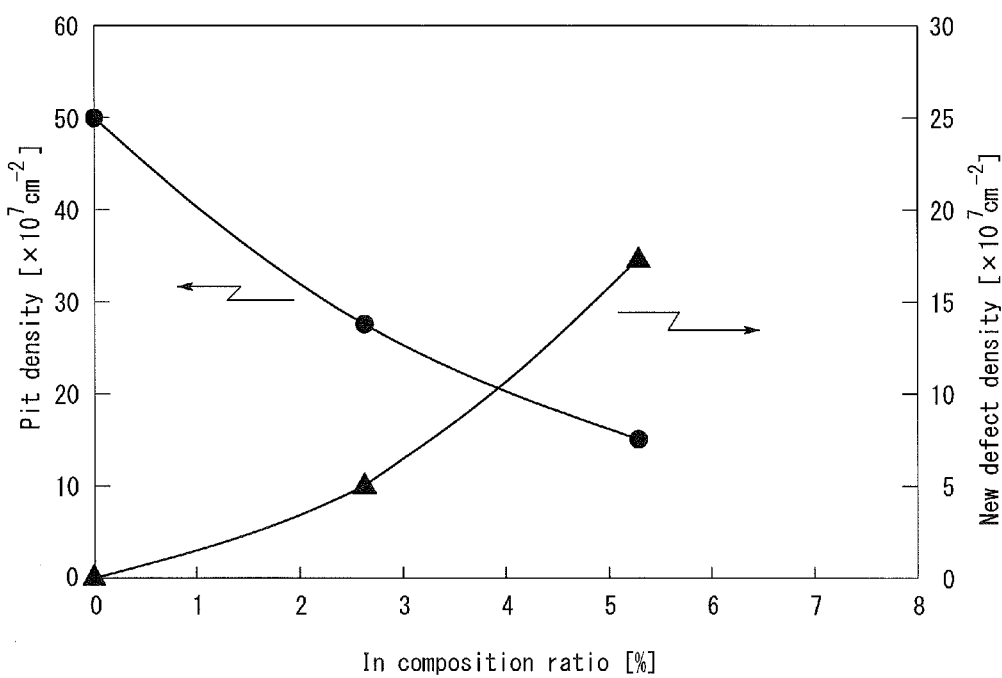
FIG. 4 is a graph showing the relationship among the In composition ratio, the pit density, and new defect density.

FIG. 4 is a graph showing the relationship among the In composition ratio of the first protective layer 12b-1, the pit density, and the new defect density on the surface of the first protective layer 12b-1. Hereinafter, pit refers to a hole generated in the crystal by a crystal defect such as a dislocation. New defect refers to a defect produced by a cause different from the cause of pit generation, which is not observed when the first protective layer 12b-1 is not doped with In.

As is clear from FIG. 4, when the first protective layer 12b-1 is not doped with In, the pit density is $5 \times 10^8/cm^2$. The pit density, however, monotonously decreases from $5 \times 10^8/cm^2$ as the In composition ratio increases. On the other hand, a new defect is not observed when the In composition ratio is 0. However, when the first protective layer 12b-1 is doped with In, a new defect occurs, and new defects monotonously increase as the In composition ratio increases.

The relative intensity changes in a curve having a peak around the In composition ratio of 3% against the change of the In composition ratio as shown in FIG. 3. From the result of FIG. 4, this can be explained as follows. As the In composition ratio increases, the pits are filled and reduced in number due to the effect of In as a surfactant. Therefore, the crystallinity of the protective layer 12b-1 is gradually improved, thereby contributing to the improvement of emission performance. On the other hand, as the In composition ratio increases, new defects increases. Therefore, the crystallinity of the protective layer 12b-1 is deteriorated, thereby contributing to the reduction of emission performance.

When the In composition ratio is not more than 3%, the effect of improving emission performance due to the reduction of pits is more dominant than the effect of reducing emission performance due to the increase of new defects. Therefore, the relative intensity gradually increases until the In composition ratio reaches 3%. However, when the In composition ratio exceeds 3%, the relative intensity gradually decreases because the increasing rate of emission performance due to the reduction of pits decreases and the decreasing rate of emission performance due to the increase of new defects increases. When the In composition ratio is equal to 4%, the relative intensity is equal to 1.00 because the decreasing amount of emission performance due to the increase of new defects is equal to the increasing amount of emission performance due to the reduction of pits. Moreover, when the In composition ratio exceeds 4%, a difference of the decreasing amount of emission performance due to the increase of new defects to the increasing amount of emission performance due to the reduction of pits increases as the In composition ratio increases. As a result, the overall emission performance is lower than that when the first protective layer 12b-1 is not doped with In.

As mentioned above, it is considered that the relative intensity changes in a curve having a peak around the In composition ratio of 3% against the increase of the In composition ratio as shown in FIG. 4 by the balance between the reduction of pits and the increase of new defects.

Embodiment 2

A Group III nitride semiconductor light-emitting device according to Embodiment 2 has a light-emitting layer 22 in which the protective layer 12b of the light-emitting layer 12 of the Group III nitride semiconductor light-emitting device according to Embodiment 1 is replaced with a protective layer 22b. Other structures are the same as those of Embodiment 1.

Figure 5:
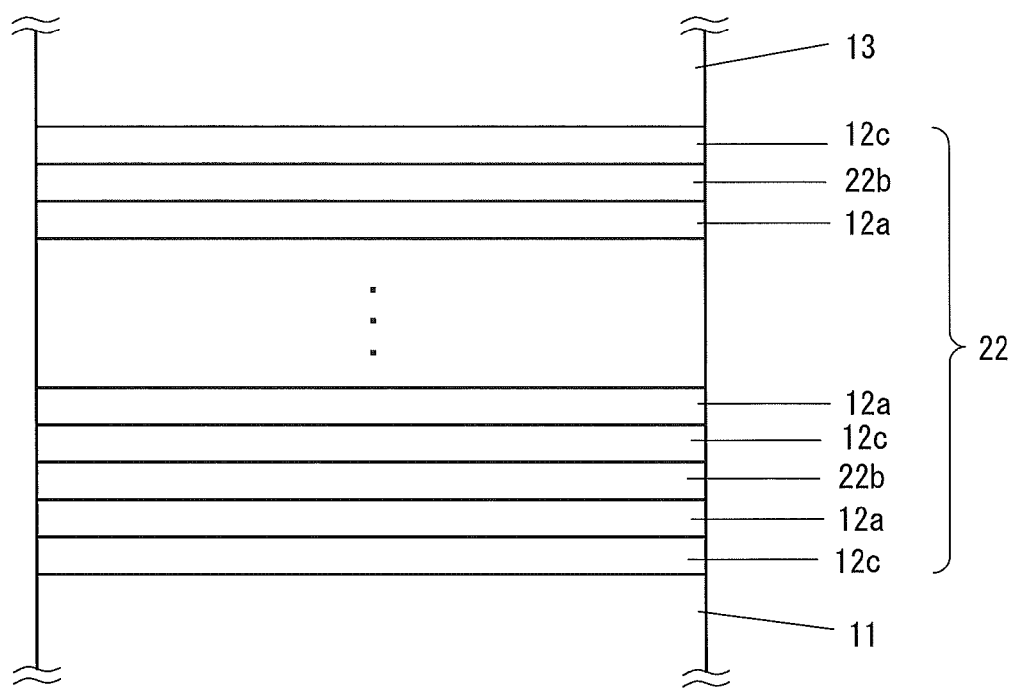
FIG. 5 shows the structure of a light-emitting layer of a Group III nitride semiconductor light-emitting device according to Embodiment 2.

FIG. 5 shows the structure of the light-emitting layer 22 of the Group III nitride semiconductor light-emitting device according to Embodiment 2. The light-emitting layer 22 has a MQW structure in which a plurality of layer units are repeatedly deposited three to ten times, each layer unit comprising a well layer 12a, a protective layer 22b, and a barrier layer 12c deposited in this order. However, the layer being in contact with the n-type layer 11 is the barrier layer 12c.

The protective layer 22b is a single AlGaInN layer. The protective layer 22b has a bandgap larger than that of the well layer 12a. Moreover, the protective layer 22b has an In composition ratio of more than 0% and not more than 4%. Such a range of In composition ratio can improve emission performance as in Embodiment 1. The In composition ratio range is, more preferably, 1.5% to 3.5%, and further preferably, 2% to 3%.

The protective layer 22b has a thickness of 0.2 nm to 1.8 nm. Such a thickness range reduces carriers trapped or recombined in the protective layer 22b, and improves emission performance. The thickness range is, more preferably, 0.5 nm to 1.6 nm, and further preferably, 0.5 nm to 1.1 nm.

The protective layer 22b may have any Al composition ratio as long as the protective layer 22b has a bandgap larger than that of the well layer 12a. For example, the Al composition ratio may be four to five times the Al composition ratio of the barrier layer 12c.

A similar effect as that of the Group III nitride semiconductor light-emitting device according to Embodiment 1 can be obtained in the Group III nitride semiconductor light-emitting device according to Embodiment 2. That is, the protective layer 22b is formed of AlGaInN, and the In composition ratio is more than 0% and not more than 4%. Therefore, the reduction of emission performance is suppressed by providing the protective layer 22b, thereby improving emission performance.

The present invention is not limited to the Group III nitride semiconductor light-emitting devices having the structures according to Embodiments 1 and 2, and can be applied to a Group III nitride semiconductor light-emitting device having any structure, so long as it has a MQW structure-light-emitting layer. For example, the present invention can be applied to a flip-chip type light-emitting device or a light-emitting device having a vertical conductive structure obtained by using a conductive substrate or removing a substrate by a laser lift-off technique.

In Embodiments 1 and 2, the well layer 12a is formed of InGaN. However, the present invention is not limited to this, so long as the well layer 12a is formed of Group III nitride semiconductor containing In. The well layer 12a may be doped with n-type impurity such as Si. For example, the well layer 12a may be formed of AlGaInN. In Embodiments 1 and 2, the barrier layer 12c is formed of AlGaN. However, the present invention is not limited to this, so long as the barrier layer 12c is formed of Group III nitride semiconductor containing Al and having a bandgap larger than that of the well layer 12a. For example, the barrier layer 12c may be formed of AlGaInN.

The Group III nitride semiconductor light-emitting device of the present invention can be employed as a light source of an illumination apparatus or a display apparatus.

What is claimed is:

1. A Group III nitride semiconductor light-emitting device having a multiple quantum well structure light-emitting layer,
   wherein the light-emitting layer comprises a structure in which a plurality of layer units are repeatedly deposited, each layer unit comprising a well layer, a protective layer consisting of a first protective layer and a second protective layer on the well layer, and a barrier layer on the first protective layer sequentially deposited;
   wherein the well layer consists of InGaN;
   each of the first protective layer and the second protective layer has a bandgap larger than a bandgap of the well layer, and the second protective layer consists of GaN disposed in contact with and on the well layer and the first protective layer is disposed in contact with and on the second protective layer and in contact with the barrier layer, the first protective layer consisting of AlGaInN having an In composition ratio not less than 1.5% and not more than 3.5%; and
   the barrier layer consists of AlGaN;
   wherein the first protective layer and the second protective layer are grown at the same temperature as employed for the well layer, and the barrier layer is grown at a barrier growth temperature higher than a temperature employed for the well layer;
   wherein the first protective layer and the second protective layer covers the well layer to prevent the evaporation of In from the well layer while raising a temperature to the barrier growth temperature for forming the barrier layer after the formation of the well layer.

2. The Group III nitride semiconductor light-emitting device according to claim 1, wherein the first protective layer has a thickness of 0.2 nm to 1.8 nm.

3. The Group III nitride semiconductor light-emitting device according to claim 1, wherein the first protective layer has a thickness of 0.2 nm to 1.8 nm, and the second protective layer has a thickness of 0.2 nm to 1.8 nm.

4. The Group III nitride semiconductor light-emitting device according to claim 1, wherein the first protective layer has an Al composition ratio four to five times the Al composition ratio of the barrier layer.

5. The Group III nitride semiconductor light-emitting device according to claim 2, wherein the first protective layer has an Al composition ratio four to five times the Al composition ratio of the barrier layer.

6. The Group III nitride semiconductor light-emitting device according to claim 3, wherein the first protective layer has an Al composition ratio four to five times the Al composition ratio of the barrier layer.

* * * * *